(12) United States Patent
Huang et al.

(10) Patent No.: US 9,391,010 B2
(45) Date of Patent: Jul. 12, 2016

(54) POWER LINE FILTER FOR MULTIDIMENSIONAL INTEGRATED CIRCUITS

(75) Inventors: Bo-Jr Huang, Tainan (TW); Yi-Wei Chen, Taichung (TW); Kuan-Yu Lin, Zhudong Township (TW); Chin-Chou Liu, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 291 days.

(21) Appl. No.: 13/437,047

(22) Filed: Apr. 2, 2012

(65) Prior Publication Data

US 2013/0257564 A1   Oct. 3, 2013

(51) Int. Cl.
*H03H 7/01* (2006.01)
*H01L 23/498* (2006.01)
(Continued)

(52) U.S. Cl.
CPC ........ *H01L 23/49822* (2013.01); *H01L 23/147* (2013.01); *H01L 23/49827* (2013.01); *H01F 2017/0086* (2013.01); *H01L 25/0652* (2013.01); *H01L 25/18* (2013.01); *H01L 2224/131* (2013.01); *H01L 2224/16145* (2013.01); *H01L 2224/16225* (2013.01);
(Continued)

(58) Field of Classification Search
CPC .................. H03H 7/0115; H03H 2001/0085; H01L 23/49827; H01L 23/147; H01L 23/49822; H01L 23/29822
USPC ....................................................... 333/177
See application file for complete search history.

(56) References Cited

U.S. PATENT DOCUMENTS 6,847,269 B2   1/2005   Watanabe et al.
8,786,381 B2 * 7/2014   Kimball .............. H01F 27/2804
                                                     333/238
(Continued)

FOREIGN PATENT DOCUMENTS

JP       2008-4853 A      1/2008
JP     2008004853 A      1/2008
(Continued)

OTHER PUBLICATIONS

JP 2008-004853, Examiner supplied machine translation.*
(Continued)

*Primary Examiner* — Stephen E Jones
*Assistant Examiner* — Scott S Outten
(74) *Attorney, Agent, or Firm* — Duane Morris LLP

(57) ABSTRACT

An interposer element in a multidimensional integrated circuit with stacked elements has one or more conductors, especially power supply lines, coupled through decoupling networks defining low impedance shunts for high frequency signals to ground. The interposer has successive tiers including silicon, metal and dielectric deposition layers. The decoupling network for a conductor has at least one and preferably two reactive transmission lines. A transmission line has an inductor in series with the conductor and parallel capacitances at the inductor terminals. The inductors are formed by traces in spaced metal deposition layers forming coil windings and through vias connecting between layers to permit conductor crossovers. The capacitances are formed by MOS-caps in the interposer layers. An embodiment has serially coupled coils with capacitances at the input, output and junction between the coils, wherein the coils are magnetically coupled to form a transformer.

19 Claims, 18 Drawing Sheets

(51) Int. Cl.
  *H01L 23/14* (2006.01)
  *H03H 1/00* (2006.01)
  *H01L 25/065* (2006.01)
  *H01L 25/18* (2006.01)
  *H01F 17/00* (2006.01)

(52) U.S. Cl.
  CPC ........... *H01L 2225/06513* (2013.01); *H01L 2225/06517* (2013.01); *H01L 2225/06541* (2013.01); *H01L 2225/06548* (2013.01); *H01L 2924/13091* (2013.01); *H01L 2924/1421* (2013.01); *H01L 2924/1431* (2013.01); *H01L 2924/1434* (2013.01); *H01L 2924/15311* (2013.01); *H01L 2924/16172* (2013.01); *H01L 2924/19105* (2013.01); *H01L 2924/3011* (2013.01); *H01L 2924/30105* (2013.01); *H01L 2924/30107* (2013.01); *H03H 7/0115* (2013.01); *H03H 2001/0085* (2013.01)

(56) References Cited

U.S. PATENT DOCUMENTS

| | | | | |
|---|---|---|---|---|
| 2004/0150500 | A1* | 8/2004 | Kiko | 336/90 |
| 2008/0272875 | A1* | 11/2008 | Huang et al. | 336/182 |
| 2009/0051018 | A1* | 2/2009 | Moline | 257/675 |
| 2010/0091473 | A1 | 4/2010 | Kiwitt et al. | |
| 2011/0254123 | A1* | 10/2011 | Sellathamby et al. | 257/531 |

FOREIGN PATENT DOCUMENTS

| | | |
|---|---|---|
| JP | 2010246154 | 10/2010 |
| KR | 10-2010-0023816 | 3/2010 |

OTHER PUBLICATIONS

Yoon, K. et al., "Modeling and Analysis of Coupling between TSVs, Metal, and RDL interconnects in TSV-basaed 3D IC with Silicon Interposer", 2009 11th Electronics Packaging Technology Conference, pp. 702-706.

Bermond, C., et al, "High Frequency Characterization and Modeling of High Density TSV in 3D Integrated Circuits", IEEE Workshop on Signal Propagation on Interconnects, SPI 2009, pp. 1-4.

Official Action issued Aug. 18, 2013, in counterpart Korean Patent Application No. 10-2012-0072980.

Notice of Allowance issued Jan. 3, 2014, in counterpart Korean Patent Application No. 10-2012-0072980.

* cited by examiner

POWER LINE FILTER FOR MULTIDIMENSIONAL INTEGRATED CIRCUITS

BACKGROUND

This disclosure relates to techniques for decoupling or isolating circuits and portions of circuit packages from high frequency noise on power supply lines and other conductors. An embodiment has an interposer element with a through-semiconductor via forming part of a conductor coupling with operational elements, especially elements stacked on the interposer in a 2D or 3D integrated circuit configuration. An inductor is provided within the interposer, using a conductive coil, or two or more magnetically coupled coils (a transformer), formed along plural layers of the interposer with vias running between the layers adjacent to crossing points. In these or other embodiments, two or more series coupled loops are magnetically coupled, forming a transformer. The series inductance is combined with one or more MOS capacitor arrays (MOSCaps) to provide a low impedance ground path at frequencies above operational circuit frequencies.

Voltage supply circuits to circuit loads inherently have serial resistances that cause the voltage applied a circuit load to vary according to the current amplitude conducted to the load from any given reference voltage associated with the power supply to the load. The internal resistance of the power supply and the serial resistance of the conductors coupling the supply voltage to the various circuit loads are subject to Ohm's law, whereby a voltage drop E=IR reduces the supply voltage at a more positive power supply terminal to the load, and also increases the voltage level at the ground or more negative terminal of the load. Typically, plural circuit loads are successively coupled along power supply conductors, such that current coupled through loads that are closer to the power supply load the supply voltage and produce an IR voltage drop that affects the supply voltage level at loads that are farther along the power supply conductor.

Particularly in digital integrated circuits, various loads comprise switched circuits producing high frequency signals. In connection with complementary metal oxide semiconductor (CMOS) devices such as digital latches and memories, for example, a spike of current is conducted when switching states. Some leakage current is conducted when maintaining a logic state, but leakage current is small amplitude and steady in amplitude, whereas high di/dt signals cause greater problems in terms of noise.

A solution for isolating a circuit load from noise on a power supply is to provide the load with a decoupling circuit. For example, a decoupling capacitor is placed across the power supply terminals of a load circuit, or coupled to power supply conductors nearby and leading into the load circuit. The capacitor is normally charged to a nominal voltage. If IR should droop or the negative level should bounce due to noise or with momentary IR loading of the supply line by the circuit or by neighboring circuits, charge conducted from the decoupling capacitor supplies part of the shortfall.

The capacitor can be deemed to form part of a low pass filter that attenuates noise at frequencies above some cross over frequency that can be determined with reference to capacitance and resistance values. The capacitor is coupled in parallel with the load circuit power supply terminals. The load and its parallel decoupling capacitor are coupled to the power supply through the series resistance of the power supply conductors. The capacitor decouples the load from noise on the power line and from the voltage supply droop and ground bounce the other circuits. It is often appropriate to provide a distribution of decoupling capacitors over the area of a circuit, each decoupling local load devices from noise on the power supply conductors, which may involve parallel conductive paths, conductive surfaces such as ground planes, etc. One technique for decoupling loads at points distributed over the area of a circuit could be to provide an array of decoupling capacitors, each capacitor, or perhaps groups of adjacently placed parallel capacitors, serving a point or node in a circuit. The decoupling capacitors are spaced and distributed over the area of the circuit. Alternatively or additionally, decoupling capacitors are provided at points where a power supply conductor is coupled with a particular circuit element to be decoupled.

In one possible arrangement, the decoupling capacitors are MOS capacitors ("MOScaps"), laid out in the superimposed layers in an integrated circuit element. Where the MOScaps are to function as individual capacitors in a distributed array, each is isolated from nearby adjacent capacitors. Alternatively, the MOScaps are coupled in parallel with one another such that their capacitance is summed.

The term MOS in this context is an acronym for a "metal-oxide-semiconductor" and refers to a configuration typical of a field effect transistors (FETs). The metal represents a gate. Actually in modern MOS devices, the gate is typically a conductive material such as polycrystalline silicon rather than a metal. The oxide represents a dielectric layer under the gate. The semiconductor layer below that is typically silicon. A MOScap resembles a field effect transistor structure, i.e., a metal-oxide-semiconductor configuration formed in superimposed layers, except there are no connections for a source or drain. The device represents a capacitor whose terminals are the gate and the semiconductor body, separated from one another by the dielectric layer. Due to charge carrier depletion, the capacitance of a MOScap is influenced by the voltage applied between the gate and the semiconductor body. There is also some current leakage through a MOScap.

In certain integrated circuit configurations that are now known as multidimensional configurations, operative circuit packages are formed by integrated circuit elements that are stacked one atop another (in 3D configurations) or at least an integrated circuit element is supported on an interposer element that in turn is supported on a base or substrate (2.5D configurations). Circuit packages with distinctly different functions can be employed on upper layers, such as digital memories and processors, and also RF and analog devices, mounted adjacent to one another on a passive interposer in which conductors extend laterally and vertically to make necessary connections to and between the circuit packages.

Conductive areas or "pads" on the underside of respective upper circuit and bear against solder balls resting on the upper side of the lower circuit. Typically a smaller number of input/output and power supply terminals are coupled at the underside of a base or substrate by larger and more widely spaced solder balls. At the next upper connections between stacked elements, more numerous solder balls are provided, each ball being smaller and the balls being more closely spaced to accommodate more electrically conductive paths.

Connections running laterally through the passive interposer are provided by metal or conductive semiconductor material (e.g., polycrystalline silicon) deposited in lines such as in channels formed in a given semiconductor layers by deposition and etching, mechanical polishing, optical resist application and patterned removal and the like. Conductors that extend vertically through a substrate or interposer or intermediate integrated circuit are made by through-semiconductor vias ("TSV"s), as zones of conductive material that are aligned in successive adjacent layers and thus form conductors proceeding up through the layers. Electrical connections that are displaced laterally or longitudinally or be made through lines along a given layer, and combinations of lateral, longitudinal and vertical paths are made so as to establish a variety of potentially complex connections. If a new configuration of operative circuits is to be designed, it remains a relatively simple manner to make the necessary connections from the substantially any solder ball or contact pad at the substrate, through the passive interposer, to any contact pad on the respective operative circuits. These connections are made by planning out the longitudinal, lateral and vertical conductors in the interposer. The interposer typically is a passive connection making block of semiconductor material wherein longitudinal/lateral and vertical conductive paths can be defined to make such connections as required.

In connection with a 2.5D or 3D circuit arrangement, separate decoupling capacitors comprising a capacitor or a group of parallel capacitors, may be provided for each point at which a power supply conductor is coupled through a substrate or passive interposer to an operative circuit element. The amount of capacitance that is effective for decoupling (or, in other words, effective for forming a low pass filter with an appropriate cutoff frequency), is chosen to filter or decouple noise at and above a characteristic noise frequency. A large number of MOScap elements may be needed, coupled in parallel, to provide the capacitance necessary to decouple an operative circuit element, or another discrete load on the power supply terminals.

Parallel capacitance coupled with serial resistance forms a low pass filter against noise propagating along the power supply conductors because the capacitor is charged through the serial resistance of the conductors. It is possible to use an inductor rather than a capacitor as the reactive element in a low pass filter, in which case the inductor is the series element and the parallel resistances at the power supply and at the load are parallel elements. It would be possible theoretically to decouple an operative circuit element from noise on a power line conductor using inductors, but the layered arrangement of a semiconductor lends itself to using MOScaps as the reactive elements of a decoupling circuit. MOScaps are useful in passive circuit interposers at least because there are layers available in which MOScaps are readily formed. But it would be advantageous to reduce the disadvantages of MOScaps, particularly the associated current leakage and the use of large circuit areas, while exploiting the presence of layered circuit devices such as passive circuit interposers in 2.5D and 3D integrated circuits.

SUMMARY

It is an object of the present disclosure to exploit the capabilities of circuit devices capable of carrying layered conductors, dielectric layers and semiconductor materials by taking advantage of the three dimensional nature of such circuits, in particular to form an optimal set of reactive components (capacitors and inductors) arranged to decouple operative elements from noise on power supply lines.

Another object or aspect of the disclosure is to employ a portion of multi-tiered integrated circuit elements through which power supply conductors are routed, to arrange along the power supply current paths one or more reactive decoupling elements or filters, containing a low impedance path, preferably near an ideal impedance path, to sink high frequency signals.

In one embodiment, a reactive decoupler or filter comprises a combination of capacitors and inductors, formed in the integrated circuit layers. The capacitors include MOScap element encompassing superimposed, semiconductor, dielectric and gate portions in superimposed layers. The inductors coils are formed by routing conductive lines, for example of polycrystalline silicon (abbreviated "polysilicon") in one or more loops or coils having turns conductive turns or at least terminal connections that are overlaid in part by routing the conductors in a loop and also up or down through the integrated circuit layers. In one embodiment, plural helically wound looped sections are superimposed in different layers so as to couple magnetically, thereby forming a transformer. The inductors, transformers and capacitors are coupled to provide a filter along a power supply line, forming a low pass filter that decouples loads on the power supply line from high frequency noise.

Advantageously, the reactive filter for decoupling loads is arranged in plural semiconductor layers of a connection element such as a passive interposer typically used to make conductive connections that require conductors to extend laterally or longitudinally over a span of displacement in a given circuit layer, and also orthogonally (i.e.,) vertically along through-semiconductor vias, extending conductors from one superimposed layer to another. As constructed in the layers of conductors, dielectric and semiconductor body material, an optimized combination of inductance arranged in series with loads coupled to power supply and capacitance coupled in parallel with the loads, provides an improved solution for decoupling loads from high frequency noise, using less circuit area and having less current leakage than conventional decoupling techniques.

In an embodiment, an interposer element in a multidimensional integrated circuit with stacked elements has one or more conductors, especially power supply lines, coupled through decoupling networks defining low impedance shunts for high frequency signals to ground. The interposer has successive tiers including silicon, metal and dielectric deposition layers. The decoupling network for a conductor has at least one and preferably two reactive transmission lines. A transmission line has an inductor in series with the conductor and parallel capacitances at the inductor terminals. The inductors are formed by traces in spaced metal deposition layers forming coil windings and through vias connecting between layers to permit conductor crossovers. The capacitances are formed by MOScaps in the interposer layers. An embodiment has serially coupled coils with capacitances at the input, output and junction between the coils, wherein the coils are magnetically coupled to form a transformer.

Additional objects and aspects of this disclosure will become evident from the following discussion of exemplary embodiments.

BRIEF DESCRIPTION

There are shown in the drawings certain exemplary embodiments intended to illustrate aspects of the subject matter disclosed. The subject developments are not limited to the embodiments illustrated as examples, and reference should be made to the claims to assess the scope of the subject matter. In the drawings, FIG. 1 is a section view through an embodiment of a stacked integrated circuit.

Figure 8:
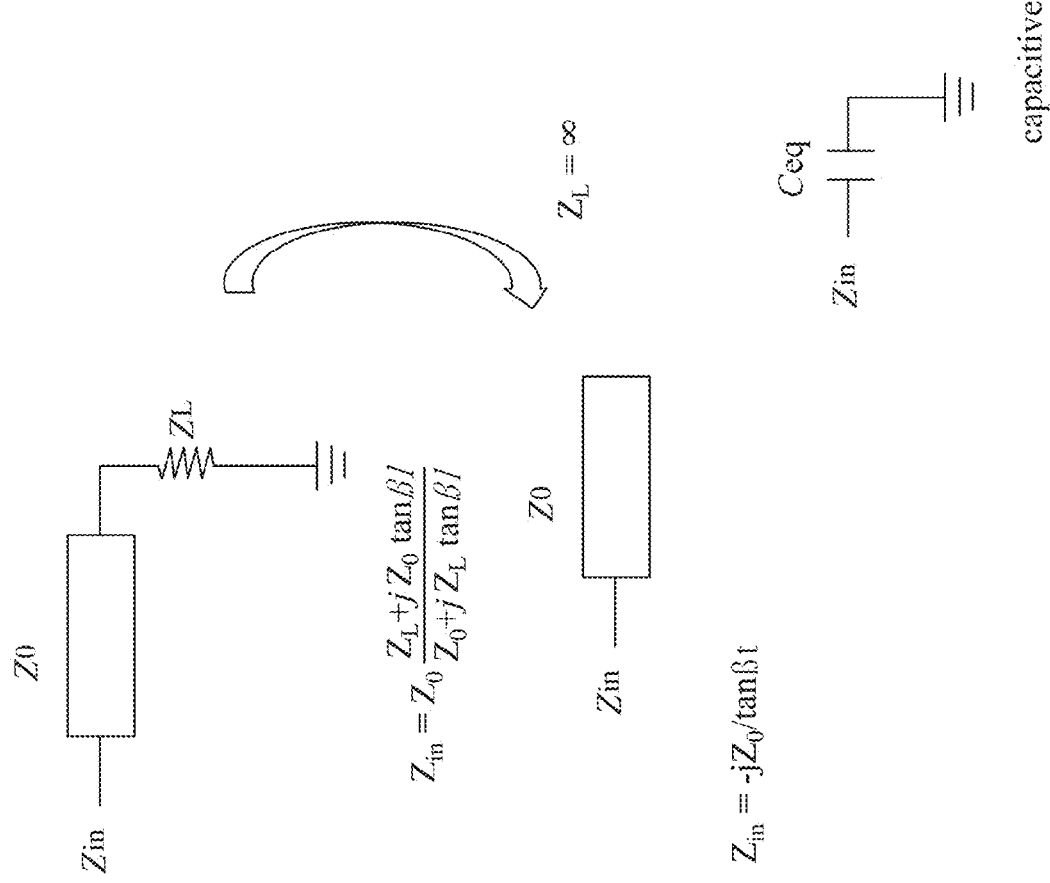
FIG. 8 shows a sequence equivalent circuits for purposes of discussion, wherein an objective of having a high impedance at a high operational frequency may be modeled as a stub transmission line having an impedance, and as parallel capacitance.

FIGS. 9a, 9b, 9c, 9d continue the sequence of FIG. 8, showing potential variations and equivalents of filter circuits containing series inductance and parallel capacitance.

Figure 10:
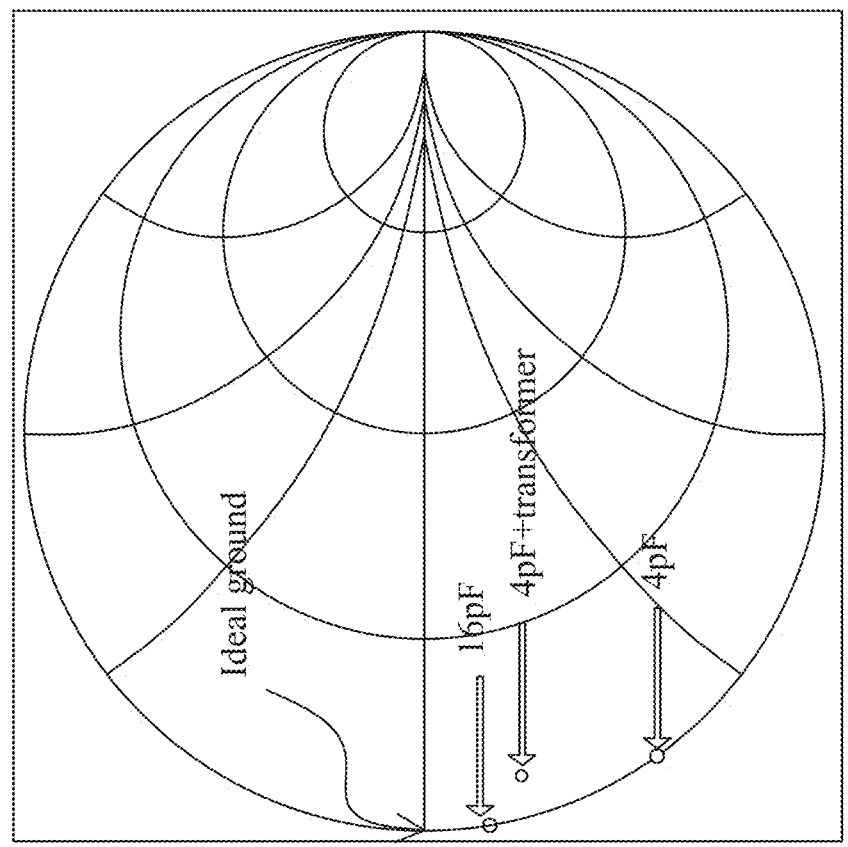

FIG. 10 is an impedance Smith chart comparing the impedances at an exemplary operational frequency using alternative filter elements as discussed herein.

Figure 11:
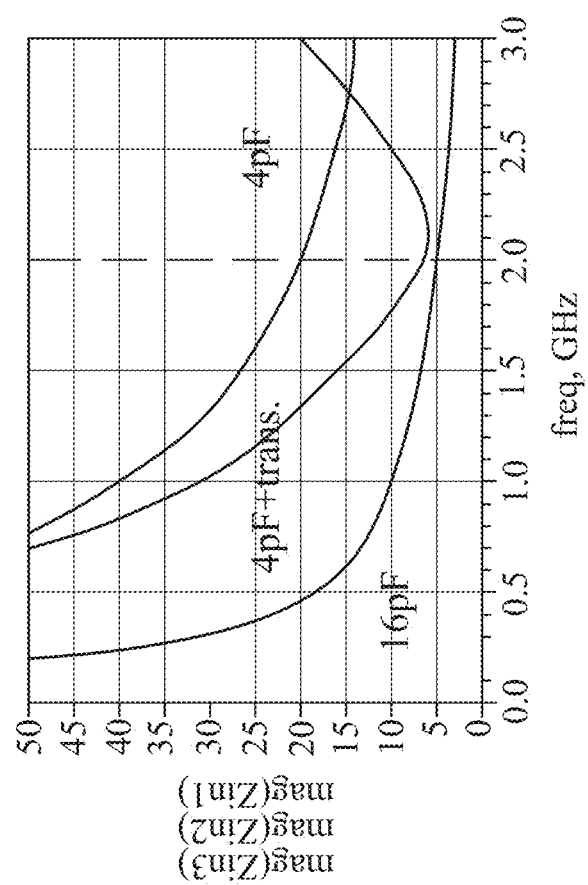

FIG. 11 is a graph of impedance magnitude as a function of frequency for the same alternative elements as shown in FIG. 10.

Figure 12:
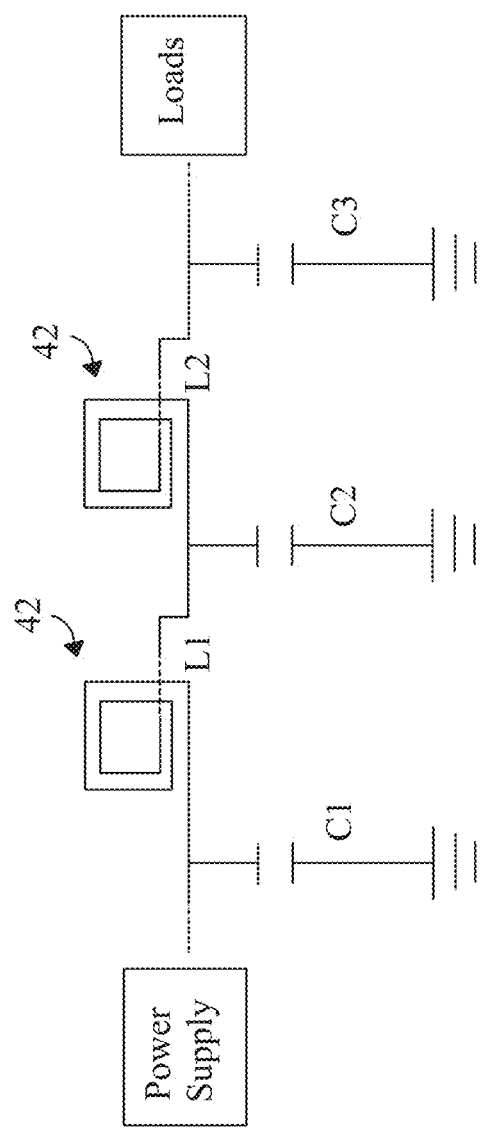

FIG. 12 is a schematic depiction of a network comprising plural serial inductors coupled at parallel capacitors.

Figure 13:
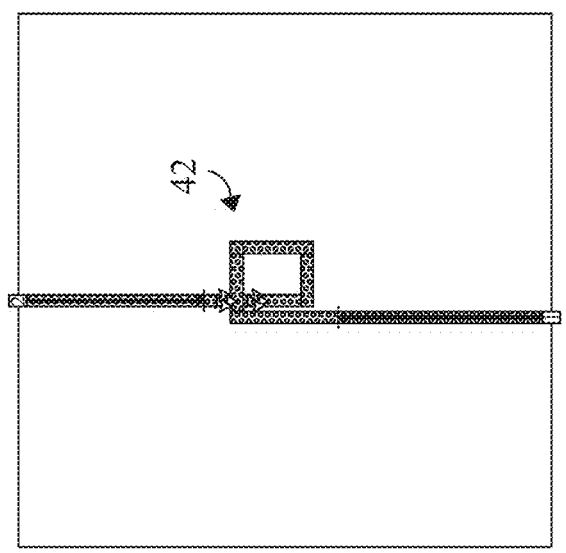

FIG. 13 is a physical depiction in plan view showing an inductor as in FIG. 12, implemented using a crossover.

Figure 14:
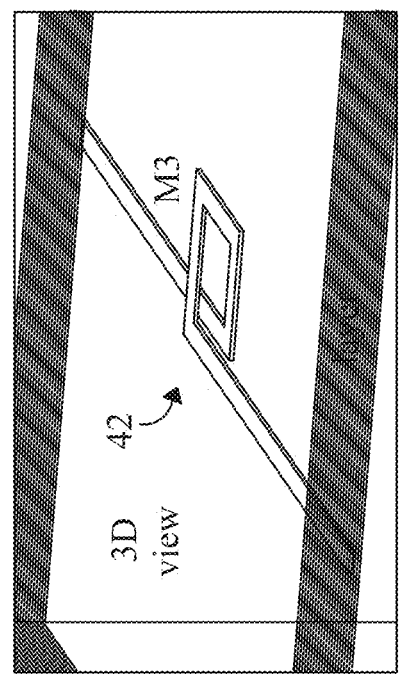

FIG. 14 is a perspective view thereof, showing the implementation of an inductor in an integrated circuit metal layer M3.

Figure 9A:
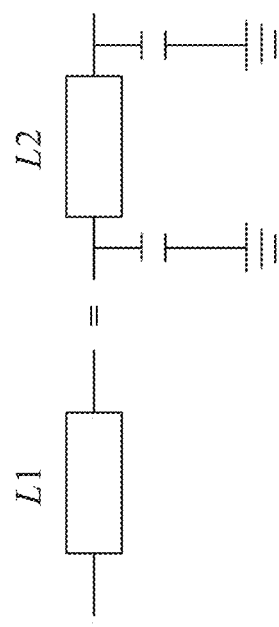
Figure 9B:
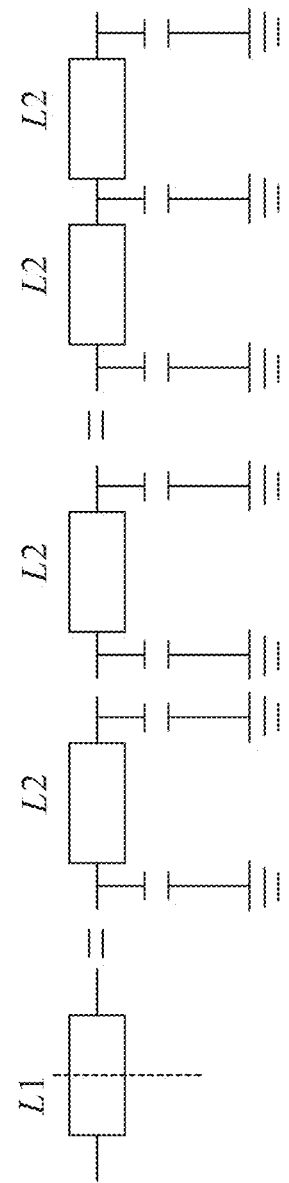
Figure 9D:
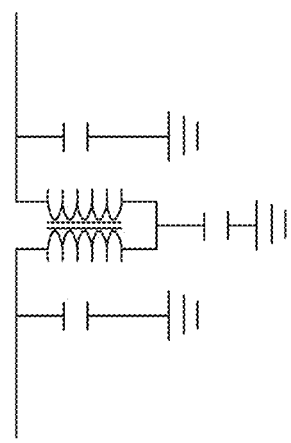
Figure 15:
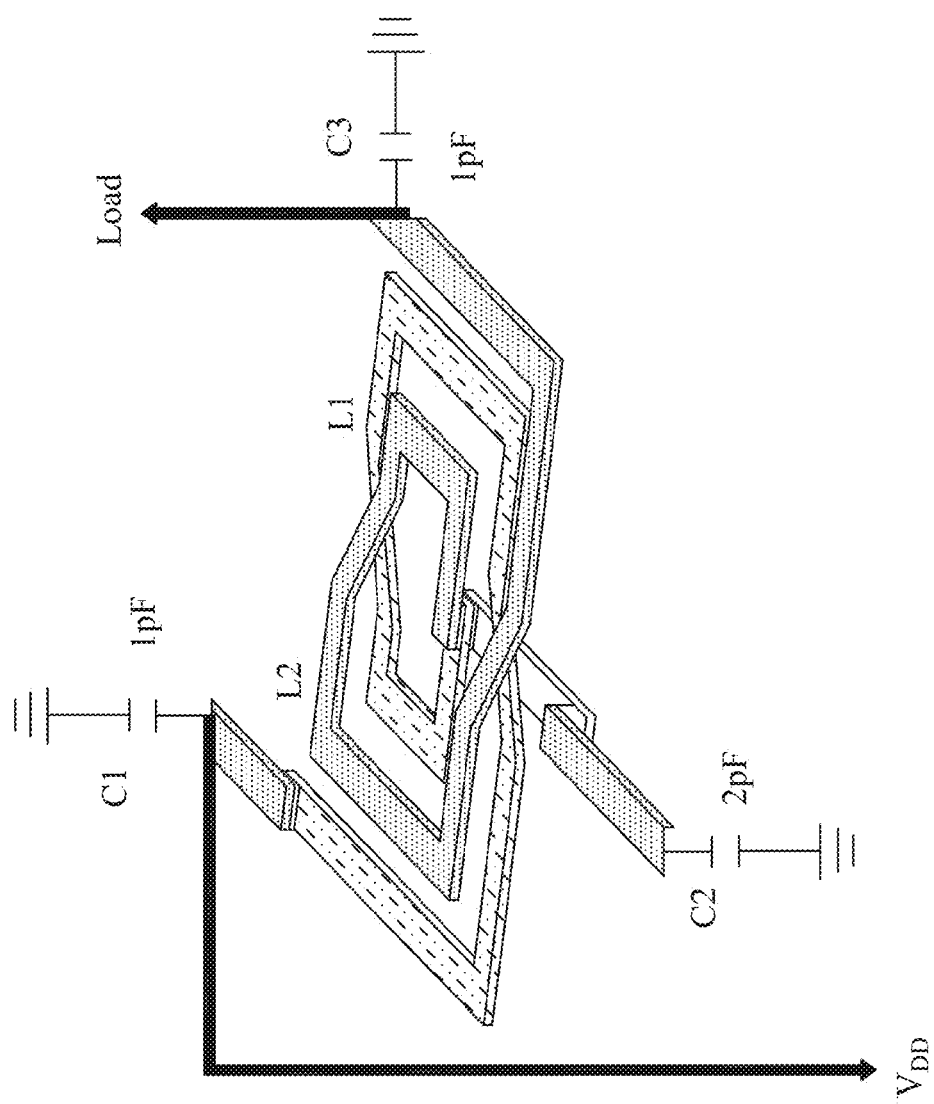

FIG. 15 is a perspective view showing implementation of the embodiment of FIG. 9d in multiple superimposed metal layers with conductors arranged with crossovers using vias, form magnetically coupled coils.

Figure 16:
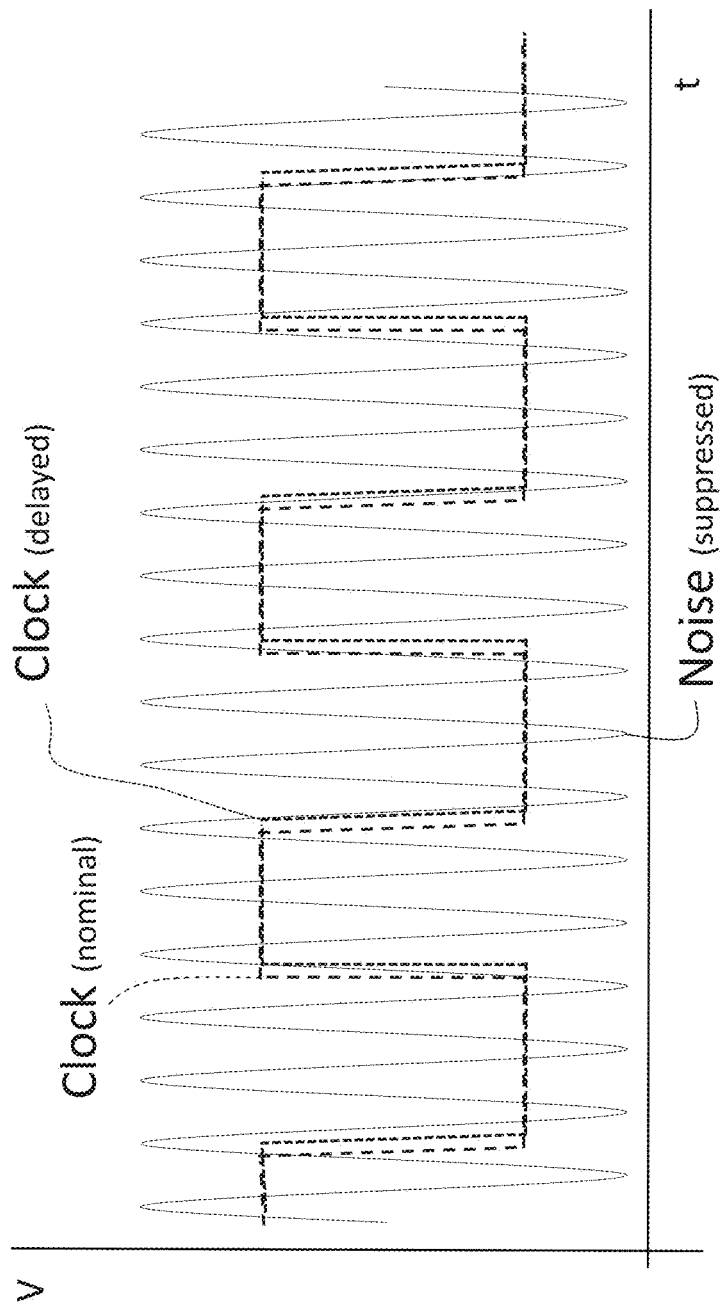

FIG. 16 shows that employing a filter as provided in the foregoing embodiments suppresses high frequency oscillation while inducing a slight phase lag in an exemplary square wave clock signal.

Figure 17:
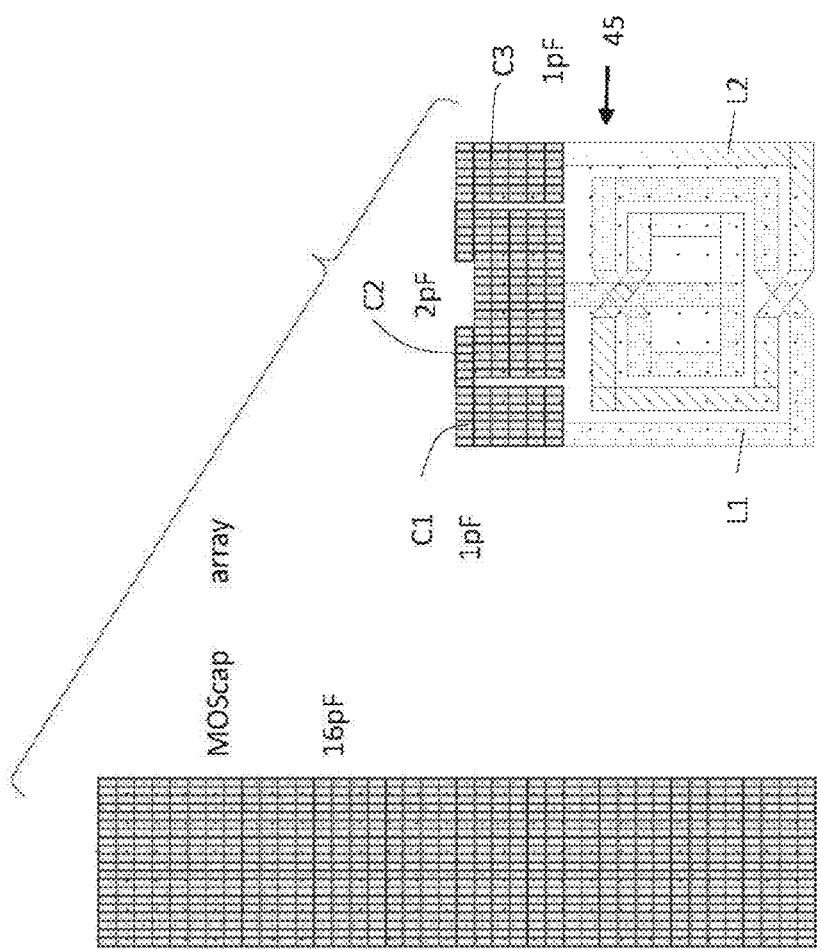

FIG. 17 compares the relative circuit areas of a 16 pF array of MOScaps for use as a decoupling capacitance, versus a network comprising a network including series coils configured as a transformer and three parallel capacitances that together total 4 pF.

Figure 18:
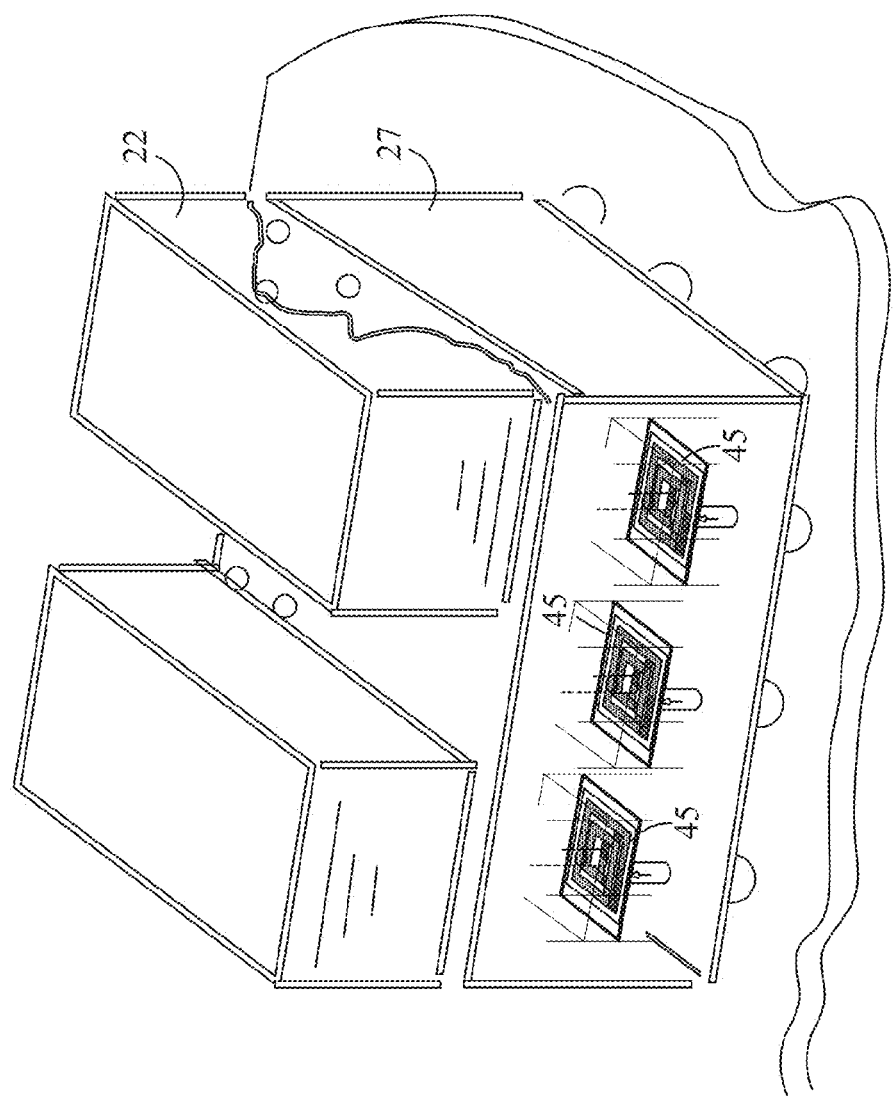

FIG. 18 is an assembly diagram showing integration of multiple networks into the semiconductor interposer of a stacked integrated circuit.

DETAILED DESCRIPTION

Figure 1:
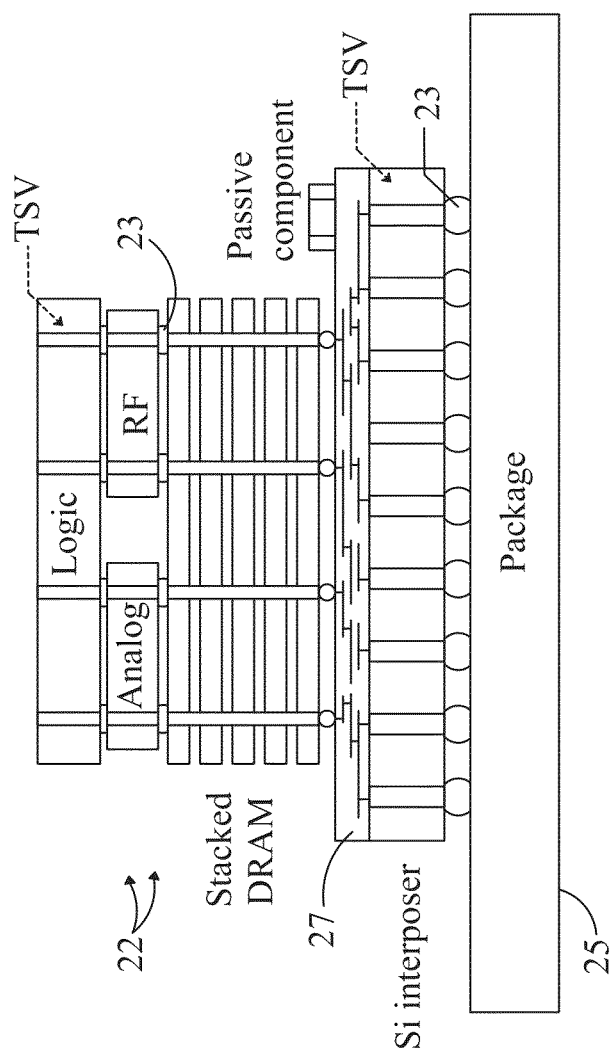
Figure 2:
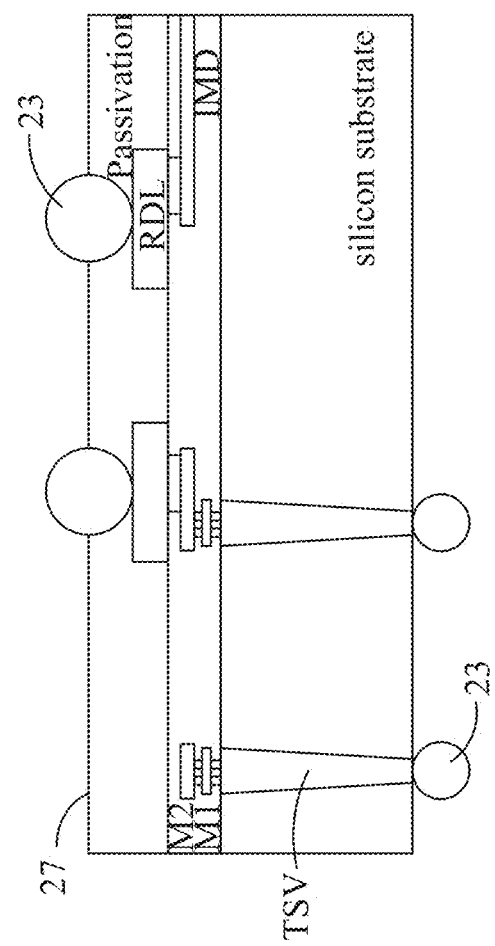
FIG. 2 is a section view through an embodiment showing exemplary connections made using through semiconductor vias and multiple metal layers.

As shown in FIGS. 1 and 2, a stacked integrated circuit is configured such that plural functional integrated circuit elements 22 are overlaid on one another and/or are arranged laterally alongside one another on a package base 25. Such arrangements are advantageous because multiple operational circuit groupings such as memories, analog circuits, digital logic, radio frequency elements and the like can be provided in one rugged solid state package. Any necessary electrically conductive connections between the stacked and/or laterally abutted operational elements are made using a combination of conductors running vertically between or through layers on the stack, and conductor traces that are deposited along selected areas of individual circuit layers.

Among other aspects, the present disclosure provides decoupling arrangements that reduce the extent to which the inductances of conductors and the stray capacitances between conductors enable unwanted variations in current, particularly unwanted oscillation at high frequencies. Series resistance, for example, produces IR drop in the supply voltage and IR ground bounce at coupled loads, the amount of which drop or bounce varies with variation in currents through the supply and ground conductors leading to and from the load. Inductance and stray capacitance also induce time varying signals that are troublesome, particularly at high frequencies. Embodiments provided herein provide space saving and power saving techniques that decouple loads on the power supply conductors from unwanted high frequency signals.

The conductors that pass through stacked layers (vertically in the orientation seen in FIG. 1) are made along Through-Semiconductor Vias ("TSV"), the semiconductor typically being silicon and the vias sometimes being termed through-silicon vias. Where connections are needed between integrally separate layers, solder bodies 23 termed solder bumps, solder "balls" or the like, depending on their relative sizes and shapes, are placed and affixed in alignment with conductors that emerge at pads on the facing surfaces of the stacked elements. The solder bodies are fused by heating during a production step to make connections between conductors and vias running through the stacked elements.

For making connections that are displaced laterally, one or more of the stacked elements include conductors coupling from the vias to other laterally spaced points. Some of the vias that couple with these lateral conductors are continuous through the levels. Some are discontinuous in the stacked direction (vertical in the orientation shown in FIG. 1). Accordingly, conductive paths are made up by connected legs of conductors, some extending vertically, and others longitudinally or laterally. The conductive paths connect the operational circuit elements to power supply voltages and ground originating off the package. The conductive paths connect nodes and signals to and from points on the operational circuit elements versus voltage or signal sources or destinations that are outside the stacked circuit elements. The conductive paths also couple between spaced on the operational circuit elements along paths that are wholly internal to the stacked elements of the package. These connections, using vias and deposited conductive traces of metal or conductive semiconductor material (such as polycrystalline silicon), couple between points on and off the operational elements of the stacked element package, in a manner similar to a patch panel, except that the vias and laterally displaced conductors are placed and deployed permanently.

In the embodiment shown in FIG. 1, the operational elements 22 of package 25 include stacked DRAM memory units, analog and RF units and are capped off at a logic element. The operational elements in this embodiment all are coupled along TSV conductors to a silicon interposer 27. At least one set of tiered layers within interposer 27 carry the combination of conductors along continuous or discontinuous vias and lateral or longitudinal conductive traces, shown in a cross section along an arbitrary plane through the stacked package 25 intersecting some of the vias and conductive traces.

FIG. 2 illustrates one embodiment of a silicon interposer 27 (also known as a semiconductor interposer) in a somewhat enlarged size and also sectioned along an arbitrary transverse plane to show the internal tiered semiconductor layer structure. The TSVs extend through the silicon substrate (or other material) to an intermediate layer at which conductive legs in the M1 and M2 metal deposition layers make lateral connections and additional vias that may be of various shapes and configurations and couple along conductive paths to longitudinally, laterally and vertically displaced connection points.

The patterns of metal at these layers is applied, for example by deposition, photoresist and etching techniques to trace conductive paths leading from one point to another and in some cases from bottom to top of the interposer 27, where solder bumps or balls 23 make connections with the base of the package 23 or to the operational elements 22 stacked on the interposer.

Figure 3:
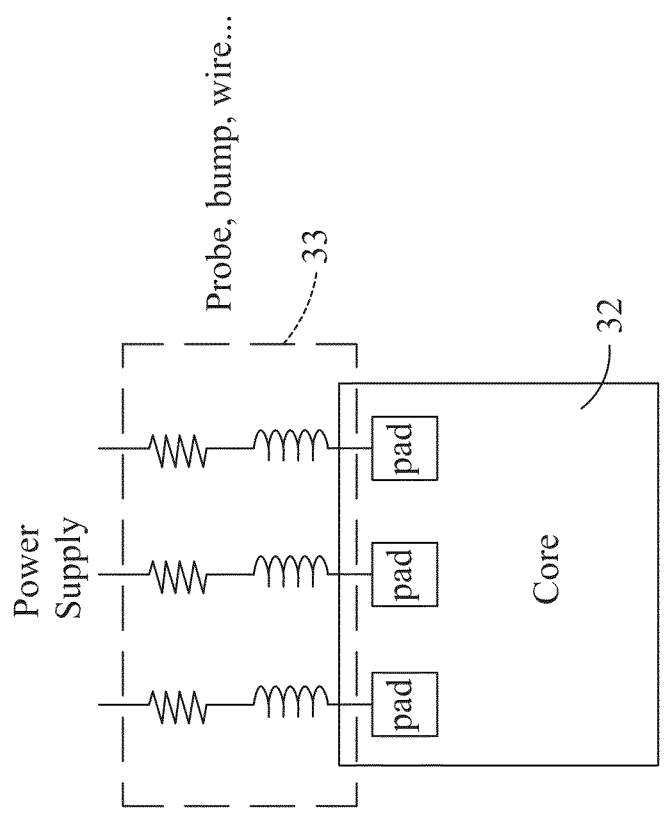
FIG. 3 is a schematic illustration showing that power supply connections to an operative core device have associated series resistance and inductance.
Figure 4:
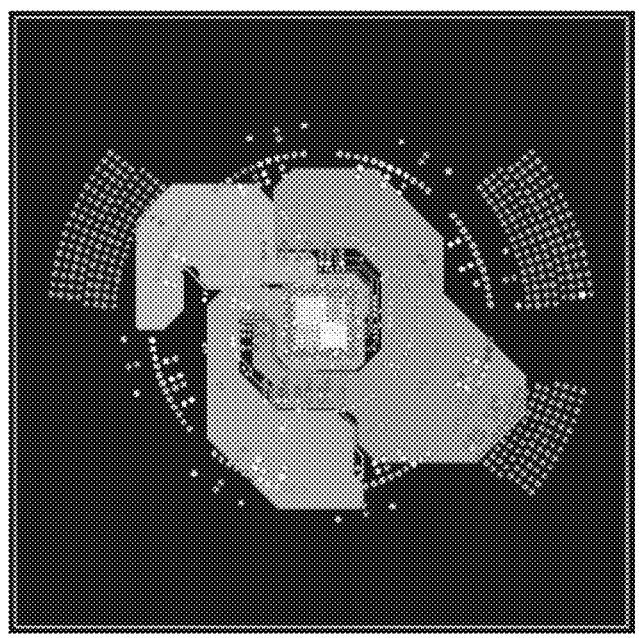
FIG. 4 is a plan view layout of a probe card.
Figure 5:
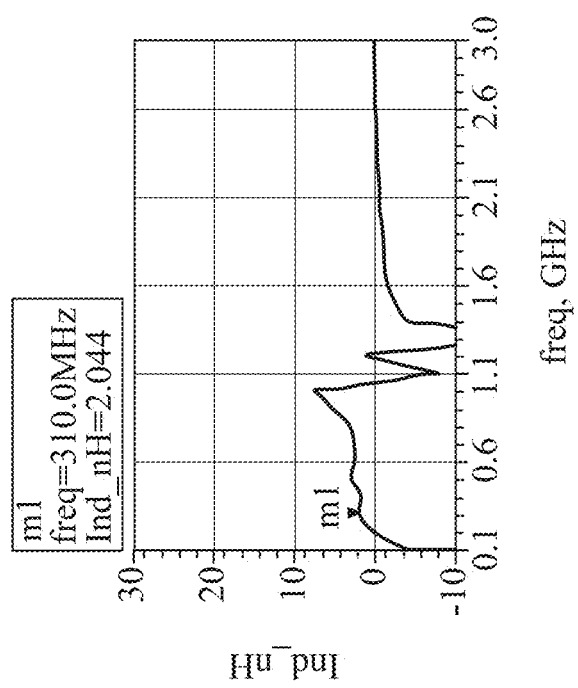
FIG. 5 shows the inductance of an exemplary connection as a function of frequency.
Figure 6:
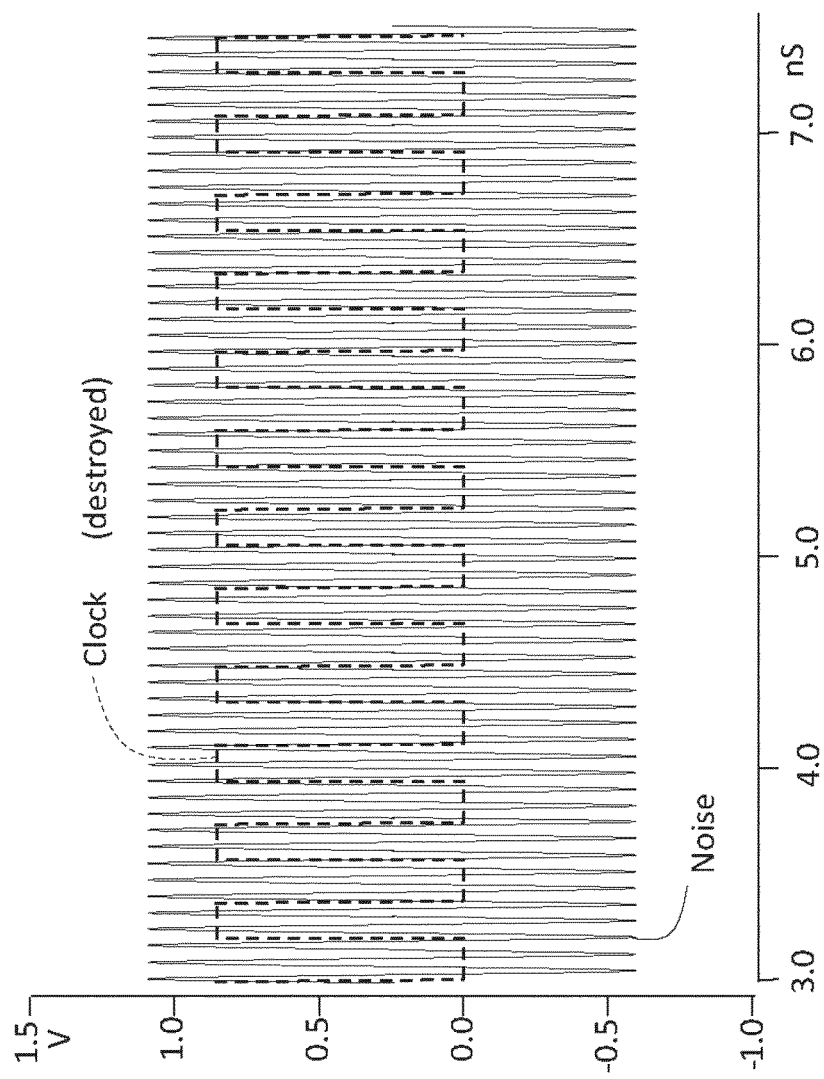
FIG. 6 is a time diagram showing how resonance and feedback associated with parasitic reactive effects can destroy a high frequency square wave clock signal (shown in dash lines), in this case leaving a higher frequency oscillation signal.

An interposer 27 and the operational elements 22 that are stacked and coupled by solder connection can be regarded as the circuit core 32, also shown in FIG. 3. Electrical connections for supply voltages and signals originating outside the core 32 are coupled to the core 32 by a set of conductors 33. Each of these conductors has inherent series resistance due to the conductor material and dimensions such as length and cross sectional area. Conductor length also determines a characteristic inductances. Where the conductors pass in proximity, stray capacitance effects apply between the conductors. In some embodiments, for example, where connections are made through a fixture such as a probe card as shown in FIG. 4, the various paths may be complex. FIG. 5 shows that the characteristic impedance of an arbitrarily selected conductor in FIG. 4, may have an impedance versus frequency characteristic with maxima and minima. As shown by an exemplary voltage-time plot in FIG. 6, a nominal square wave clock signal carried on a conductor (the clock shown in dashed lines) can be destroyed, namely because the operations of amplifiers, comparators, latches and other switching devices that generate or transmit the clock signal, can become corrupted by the resonance effects of the characteristic inductance and stray capacitance of these conductors. The effect is most pronounced at high frequencies where relatively modest values of inductance and capacitance are sufficient to produced tuned circuits that resonate at the frequencies in question. In the example of FIG. 6, the square wave signal has been destroyed and replaced by a higher frequency periodic oscillation.

Figure 7:
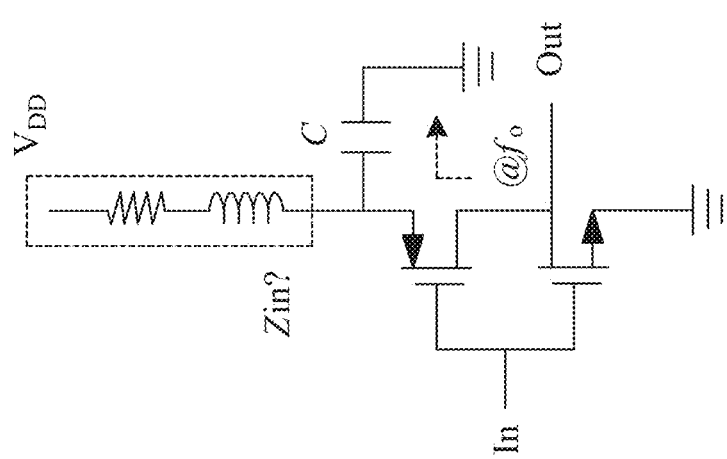
FIG. 7 is a schematic diagram of an NMOS inverter with parallel parasitic capacitance and series resistance and inductance associated with a power supply line.

FIG. 7 illustrates a switching element of an exemplary circuit comprising an inverter having two coupled MOS transistors coupled to input and output conductors and to a power supply voltage $V_{DD}$. The equivalent power supply resistance and inductance are represented by series resistance and capacitance. The particular impedance $Z_{in}$ is not particularly defined and may vary with the nature of the circuit as discussed. But what is needed is a circuit that can decouple the switching inverters from a high frequency oscillation, or in other words, to provide a good in-band AC short circuit to ground at frequencies higher than the operational frequency $f_0$ of the device.

According to RF integrated circuit design experience, a decoupling capacitance effective to decouple frequencies above an operational frequency $f_0$ should be meet the criterion:

$$C \geq \frac{1}{5 * 2\pi f_0}$$

Where the expected frequency, for example, is 2 GHz, the decoupling capacitance from this equation (C in FIG. 7) is at least 16 pF. In a 2D or 3D stacked IC, it may be impractical to include discrete decoupling capacitors for respective power supply conductors. In embodiments disclosed herein, capacitance for decoupling from high frequencies is supplied by MOS capacitors (MOScaps) in an array having sufficient circuit area or a sufficient number of parallel-coupled MOScap devices to total the decoupling capacitance needed, such as 16 pF MOScaps make efficient use of circuit area in multiple-tiered integrated circuit arrangements because areas of plural metal layers (with conductive traces) and dielectric layers are available and are exploited for use as MOScaps. But here are downsides associated with exploiting circuit area and with current leakage. A MOScap has a capacitance that varies with gate/substrate bias voltage. Assuming that one MOScap unit of 900 ηm by 2.7 μm size can produce 20 fF capacitance at a nominal 0.85V, one can calculate that 800 such units are needed in parallel to total 16 pF. The circuit area needed is 3,567 μm². This is a moderately large investment of circuit area. Each of the 800 MOScap units will contribute an incremental leakage current (estimated at 4.08×10⁻⁹ A). According to an embodiment disclosed herein, part of the reactance needed to decouple a power supply conductor from high frequency noise is provided using serial inductance and part of that reactance is contributed by parallel capacitance, especially by a MOScap array. This reactance is arranged as a balanced transmission line along the power supply conductor, with capacitances at the input and output terminal of a transmission line conductor having an inductance. The serial inductance does not contribute to current leakage. The impedance to ground is minimal above a predetermined cutoff frequency. The transmission line thus decouples loads of on the power supply conductor from high frequency noise.

Referring to FIG. 8, the input impedance $Z_{in}$ of a conductor assumed to be a transmission line of length L includes series inductance $Z_0$ and resistance $Z_L$. Both of these increase with transmission line length. The resistance of the conductor is a function of its material and cross sectional area.

$$Z_{in} = Z_0 \frac{Z_L + jZ_0\tan\beta l}{Z_0 + jZ_L\tan\beta l}$$

If the resistance modeled at the limit of an open circuit as shown in FIG. 8 (i.e., $Z_L \to \infty$), then $$Z_{in} = \frac{-jZ_0}{\tan\beta l}.$$

Equivalent circuits can be proposed using parallel capacitance, and/or series inductance. According to the above example for decoupling a load from a 2 GHz signal along a power supply conductor, what is needed is an equivalent series inductance for a parallel decoupling capacitance of 16 pF. However the required length of the transmission line to achieve an equivalent circuit using inductance, would be impractically long, considering the miniaturization of integrated circuits (perhaps requiring transmission lines of 30 mm length).

Figure 9C:
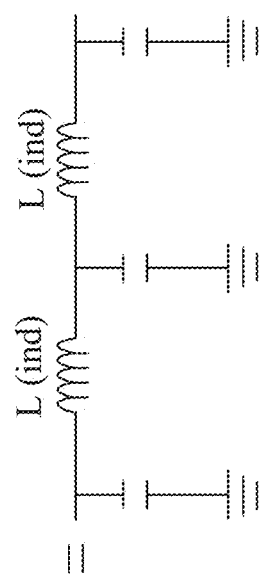

According to an embodiment shown in FIGS. 9a through 9c, the required inductance L1 represents the reactance in the example described above, equivalent to a parallel capacitor of 16 pF for an operational frequency of 2 GHz. In FIG. 9a, if an inductance L2 is less than L1, a transmission line with parallel capacitors at the terminals of a transmission line with an inductance L2 provides a transmission line with an impedance equivalent to L1. In FIG. 9b, if that transmission line has a fraction of the necessary impedance by employing a fraction of the necessary inductance and capacitance (e.g., half), plural such transmission lines (e.g., two transmission lines) are cascaded to produce the impedance equivalent of L1. Two parallel capacitors located at the junction between cascaded transmission lines are equivalent to single capacitors with capacitance equal to the sum of two parallel capacitances. Thus a transmission line with plural inductances in series, has equal parallel capacitances at the input and output, and capacitance of twice that value at each intermediate junction between inductances. A cascade of two such inductors is shown in FIG. 9c.

According to an embodiment, such a transmission line is provided along one or more power supply conductors in a semiconductor element, wherein the inductors are formed in superimposed semiconductor layers deposited as conductor traces that are arranged to form coils in at least two metal deposition layers. One or more crossovers of the conductive traces is managed by routing the conductive path through at least one via to carry the conductive trace from one metal layer to another (e.g., M2 to M3, etc.).

According to an embodiment and as shown in FIG. 9d, two or more such coils are provided and magnetically coupled, e.g., by proximity or by overlapping the lumens of the coils. This arrangement forms a transformer wherein series inductance is contributed by primary and secondary magnetically coupled coil windings. Inasmuch as the two or more coils are overlapped, they occupy the same circuit area, although they are disposed in multiple metallization layers. The circuit area needed is not multiplied according to the number of coils used.

Accordingly, a circuit configuration 25 is provided for decoupling a load circuit 22 from AC noise propagating through a conductor leading to the load circuit, the circuit configuration comprising at least one circuit element 27 having a plurality of superimposed layers, wherein at least one conductive pathway (e.g., TSV) traverses through the circuit element 27 for making electrical connections along the conductive pathway between points that are displaced from one another at least on one surface of the circuit element, the conductive pathway having an impedance characteristic. The impedance characteristic is defined in part by a decoupling circuit (FIGS. 9a-9d, 12, 15) comprising at least one capacitance (C, C1-C3) coupled in parallel with the load circuit and at least one inductance (L, L1, L2) coupled in series with the conductive pathway, wherein the capacitance and inductance form a low pass filter attenuating noise signal components at frequencies above a predetermined frequency (FIG. 11), thereby decoupling the load circuit from said noise signal components. The inductance is provided by at least one conductive coil (L1) occupying at least two of the superimposed layers (e.g., M1, M2 or M2, M3) and including at least one via TSV extending between the superimposed layers.

In embodiments shown in FIGS. 9b-9d, 12 and 15, inductance is provided by at least two conductive coils L1, L2, each respectively occupying at least two said superimposed layers. The at least two conductive loops in FIGS. 9d and 15 are placed so as to couple electromagnetically, thereby providing a transformer in series with the conductive pathway.

The capacitance is provided at least partly by a conductive area and a dielectric area in adjacent ones of the superimposed layer. Embodiments are disclosed in which the circuit element 27 comprises at least one semiconductor layer and the capacitance is provided by at least one metal-oxide-semiconductor capacitor device (MOScap) having respective conductive, dielectric and semiconductor portions disposed in adjacent ones of the superimposed layers. In FIG. 17, three zones of MOScap elements in an array are coupled to the terminals of two inductors L1, L2 in a decoupling circuit with an impedance characteristic defined by at least one transmission line L1, L2 comprising an input parallel capacitance C1, C2, a series inductance L1 or L2, and an output parallel C2 or C3 capacitance. More particularly, the impedance characteristic as shown is defined by two cascaded transmission lines, each comprising an input parallel capacitance, a series inductance and an output parallel capacitance. Furthermore, the inductances of the cascaded transmission lines are magnetically coupled, forming a transformer. In other embodiments (not shown) a plurality of more than two cascaded and coupled inductors and transmission lines are employed.

The transmission lines as described and as shown in FIGS. 1, 2, 18 are disposed along a conductive pathway through a circuit element 27 of superimposed layers. The conductive pathway traverses the circuit element 27 from a bottom to a top of the superimposed layers. Capacitances are formed at certain areas of the superimposed layers and inductances are formed at other areas, these capacitances and inductances being provided by conductors and dielectric areas in discrete areas of the superimposed layers, and coupled to one another by conductive traces. In FIG. 1, the layered circuit element comprises an interposer in a multiple dimension integrated circuit (e.g., 2.5D or 3D) having multiple said superimposed layers. The conductive pathway comprises a power supply conductor extending from a coupling point on a surface of the interposer such as a solder bump at an underside coupled to a base of package 27 arranged for electrical connection with a power source, through the superimposed layers to a connection point for an operative circuit element on a top side of the interposer. The power supply conductor can emerge at plural points. In other embodiments, the conductor is a low frequency signal such as a control level as opposed to a power supply conductor. The conductor can carry a clock signal as shown in FIG. 16. In any event, high frequency noise is suppressed.

Although the transmission line circuit configuration as described also can be provided in a layered integrated circuit operational element, in the embodiments described the circuit used for this purpose is a passive interposer 27. The interposer has multiple superimposed layers along which the conductive pathway provides a power supply conductor defined by conductive material and/or various signal connections to and between operational circuit elements 22 stacked thereon. The conductive pathways extend along through-semiconductor conductive vias and conductive traces along metallization layers (it being understood that the metallization layers in different embodiments comprise conductive poly-silicon as opposed to elemental metals). The interposer in the depicted examples consists essentially of the layers forming conductive pathways, capacitances and inductances.

FIG. 10 is a Smith chart comparing the impedance that is achieved for decoupling a power supply line from high frequency noise according to a 2 GHz operational frequency and an impedance equivalent to the recommended 16 pF decoupling capacitor discussed above (as a nonlimiting example). FIG. 11 is a graph of impedance versus frequency, comparing that alternatives of a 16 pF parallel capacitance, which comes closest to an ideal ground at 2 GHz, versus a smaller capacitance such as 4 pF. The smaller capacitance less pronounced cutoff as a function of frequency and at the 2 GHz operational target is not ideal. However a combination of series inductance from a transformer as described and the smaller 4 pF capacitance is nearly as effective as the larger capacitance. Furthermore, this arrangement has the advantage of using limited circuit area and having less leakage than techniques whereby a similar impedance might be achieved using MOScaps alone.

In FIG. 12, the two coils 42, namely coils L1 and L2, are formed by spiral windings in a squared shape. Capacitors C1 is coupled between the input to L1 and ground. Capacitor C2 is coupled between the junction between coils L1, L2 and ground. Capacitor C3 is coupled between the output of coil L2 and ground. In this example, the conductive traces forming the coils L1, L2 are arranged such that the outer traces are spaced from and surround the inner traces, which is achieved in a one-level planar deposition of metal or other conductive material, except that the trace leading to the inner winding needs to cross over the outer winding. The crossover point is arranged by coupling one of the traces that needs to cross through a via to a different metallization layer, as shown in plan view in FIG. 13 and in perspective 3D projection in FIG. 14 or a one-turn single coil. It is possible to arrange for the incoming and outgoing conductor traces to reside on different metallization layers. Alternatively, the conductor traces for the coils 42 can reside on the same metallization layer, but for a short segment at the crossover residing on a different metallization layer but being coupled in a continuous conductive path by vias extending between the layers.

In the schematic illustration of FIG. 12, the two coils 42 as shown have about two turns and are shown nearby one another, but the coils 42 are spaced. A spacing between conductors of coils or adjacent coils, for example of 20 μm or more on the scale of a stacked IC, can reduce mutual inductance effects. An increase in total inductance, on the other hand, can increase the reactance of the device and more effectively decouple the power transmission line or the like from high frequency noise. Magnetically coupling the coils 42 effectively forms a transformer (see FIG. 9d). In an embodiment shown in FIG. 15, two coils L1, L2 are magnetically coupled by superimposing their interleaved windings around a common lumen, the crossing points of the coils following vias passing from one metallization layer to the next, preferably in layers M2, M3 of a semiconductor interposer 27 (shown in FIG. 1).

In keeping with the idea of cascaded balanced transmission lines, each having an input parallel capacitance and an output parallel capacitance that are equal capacitance values, the capacitances of C1 and C3 are equal; and the capacitance of C2 is twice that of C1 and C3 (namely the capacitance of two parallel capacitances equal to C1 or C3).

It is possible to provide increased inductance by increasing the number of turns, which generally requires making the coils larger. The reactance of the device can be increased by using greater capacitance values. In the embodiment of FIG. 15, the coils L1, L2 can be on the order of 2 ηH inductance. Capacitors C1 and C3 are 1 pF capacitance. Capacitor C2 (representing the capacitance of two parallel 1 pF capacitors) is 2 pF.

Referring to FIG. 16, the high frequency noise signal that is shown is highly attenuated. Although a nominal clock signal carried on a conductor is not destroyed as discussed with respect to FIG. 6, some phase delay can be anticipated due to the reactance effects of the circuit as disclosed.

FIG. 17 compares the circuit area investment that might be devoted on one hand to a MOScap array totaling 16 pF, versus a serial decoupling network 45 as disclosed herein, having two magnetically coupled coils L1, L2 with a total of 4 pF capacitance, arranged with 1 pF at the input and output of a transformer comprising coils L1, L2, and 2 pF at the junction between the coils. Referring to the embodiment of FIG. 18, such combined MOScap and inductor decoupling networks 45 are provided in series with one or more of the power supply or signal lines brought into a 2.5D or 3D stacked circuit, for example on a through silicon via leading the conductor through the layered structure of a semiconductor interposer 27 to the operational elements 22 of the circuit.

To recap, a multidimensional circuit arrangement as disclosed comprises a circuit substrate 25 providing a power supply connection to a point on the substrate for supplying power to at least one operative circuit 22. An interposer 27 is mounted on the circuit substrate 25, e.g., by solder bumps to provide a solid body. The interposer 27 has a plurality of superimposed layers (FIGS. 1, 2), wherein at least one conductive pathway (TSV, etc. in FIG. 2) traverses through the superimposed layers of the interposer and emerges at a point on a surface of the interposer for making electrical connections along the conductive pathway between points that are displaced from one another through the interposer (FIG. 1). A decoupling circuit is disposed within the interposer and coupled to the conductive pathway. The decoupling circuit has a capacitance in parallel with a load circuit on the conductive pathway, and an inductance in series with the conductive pathway. The capacitance (C1-C3), the inductance (L1, L2) form a low pass filter attenuating noise signal components at frequencies above a predetermined frequency.

The capacitance and the inductance are provided by areas of the respective superimposed layers. Overlaid areas on two or more layers form conductors and dielectrics providing the capacitance, in particular as MOScaps. At least one looped conductive path provides the inductance, wherein the path is led from one layer to another to accomplish at least one crossing of the conductive path on different ones of the layers. In illustrated embodiments, the inductance is provided by at least one conductive loop formed by continuously coupled conductive legs occupying at least two of the superimposed layers and connected by at least one via extending between the superimposed layers. In embodiments including those illustrated in FIGS. 9d and 15, plural conductive loops are placed so as to couple the coils electromagnetically, thereby providing a transformer in series with the conductive pathway. The coils are coupled electromagnetically by placing them in proximity or by superimposing coils on a common axis or lumen.

The subject matter has been disclosed in connection with exemplary embodiments and examples. It should be understood that the subject matter is not limited to the examples, and reference should be made to the appended claims to assess the scope of the invention in which exclusive rights are claimed.

We claim:

1. A circuit configuration for decoupling a load circuit from AC noise propagating through a conductor leading to the load circuit, the circuit configuration comprising:

at least one circuit element having a plurality of superimposed layers, wherein at least one conductive pathway traverses through the circuit element for making electrical connections along the conductive pathway between points that are displaced from one another at least on one surface of the circuit element, the conductive pathway having an impedance characteristic;

wherein the circuit element attaches to the load circuit on one surface and to a package base on the other surface;

wherein the impedance characteristic is defined in part by a decoupling circuit comprising at least one capacitance coupled in parallel with the load circuit and at least one inductance coupled in series with the conductive pathway, wherein the capacitance and inductance form a low pass filter attenuating noise signal components at frequencies above a predetermined frequency, thereby decoupling the load circuit from said noise signal components;

wherein the inductance is provided by first and second conductive coils magnetically coupled with each other to form a transformer by overlapping a first portion of the first conductive coil and a first portion of the second conductive coil around a common lumen so that the overlapping portions occupy a same circuit area, wherein the first conductive coil further comprises a second portion that is continuously formed with the first portion of the first conductive coil through a first transition portion and the second conductive coil further comprises a second portion that is continuously formed with the first portion of the second conductive coil through a second transition portion, wherein the first and second portions of the first conductive coil are disposed on different layers of the plurality of superimposed layers and the first and second portions of the second conductive coil are disposed on different layers of the plurality of superimposed layers, and wherein the first transition portion shares a substantially similar cross-section with the first and second portions of the first conductive coil and extends in a direction between the first and second portions of the first conductive coil that is not perpendicular to either the first or second portions of the first conductive coil, and the second transition portion shares a substantially similar cross-section with the first and second portions of the second conductive coil and extends in a direction between the first and second portions of the second conductive coil that is not perpendicular to either the first or second portions of the second conductive coil.

2. The circuit configuration of claim 1, wherein the capacitance is provided at least partly by a conductive area and a dielectric area in adjacent ones of the superimposed layers.

3. The circuit configuration of claim 2, wherein the circuit element comprises at least one semiconductor layer and wherein the capacitance is provided by at least one metal-oxide-semiconductor capacitor device (MOScap) having respective conductive, dielectric and semiconductor portions disposed in adjacent ones of the superimposed layers.

4. The circuit configuration of claim 3, wherein the circuit element comprises an interposer having multiple said superimposed layers and the conductive pathway comprises a power supply conductor extending from a coupling point on a surface of the interposer that is arranged for electrical connection with a power source, through the superimposed layers to a connection point for an operative circuit element on a top side of the interposer.

5. The circuit configuration of claim 4, wherein the power supply conductor emerges at plural points on the top side of the interposer.

6. The circuit configuration of claim 3, wherein the circuit element comprises a passive interposer having multiple said superimposed layers along which the conductive pathway provides a power supply conductor defined by conductive material, and through which the conductive pathway extends on through-semiconductor conductive vias, wherein the interposer consists essentially of the layers forming the conductive pathway, the capacitance and the inductance.

7. The circuit configuration of claim 6, further comprising a solder ball for connection between a point on a substrate and the conductive pathway at least at one point on an underside of the interposer, a solder bump connection with the conductive pathway at least at one point on a top side of the interposer, and a circuit chip mounted on the top side of the interposer at the solder bump, whereby the circuit chip is decoupled from noise propagating from the substrate.

8. The circuit configuration of claim 3, wherein the capacitor device comprises an array of adjacent discretely formed gates forming the conductive portions, overlaying a dielectric layer and a semiconductor layer in said superimposed layers.

9. The circuit configuration of claim 3, wherein the conductive pathway traverses the circuit element from a bottom to a top of the superimposed layers, wherein the capacitance is formed of the superimposed layers and the inductance is formed in others of the superimposed layers.

10. The circuit configuration of claim 1, wherein the impedance characteristic is defined by at least two cascaded transmission lines, each comprising an input parallel capacitance, a series inductance and an output parallel capacitance.

11. The circuit configuration of claim 10, wherein the inductances of the two said cascaded transmission lines include conductors in the superimposed layers, each of the conductors forming at least one loop, and the loops of the conductors at least partly overlapping one another.

12. The circuit configuration of claim 1, wherein the at least two conductive coils, each respectively occupying at least two said superimposed layers and including at least one via extending between the superimposed layers.

13. The circuit configuration of claim 1, wherein the impedance characteristic is defined by at least one transmission line comprising an input parallel capacitance, a series inductance and an output parallel capacitance.

14. A multidimensional circuit arrangement comprising:
a circuit substrate providing a power supply connection to a point on the substrate for supplying power to at least one operative circuit;
an interposer arranged for mounting on the circuit substrate, having a plurality of superimposed layers, wherein at least one conductive pathway traverses through the superimposed layers of the interposer and emerges at a point on a surface of the interposer for making electrical connections along the conductive pathway between points that are displaced from one another through the interposer, wherein the interposer attaches to the operative circuit on one surface and to a package base on the other surface;
a decoupling circuit coupled to the conductive pathway and disposed within the interposer, the decoupling circuit comprising a capacitance in parallel with the load circuit and an inductance in series with the conductive pathway, wherein the capacitance and the inductance form a low pass filter attenuating noise signal components at frequencies above a predetermined frequency;
wherein the inductance is provided by first and second conductive coils magnetically coupled with each other to form a transformer by overlapping a first portion of the first conductive coil and a first portion of the second conductive coil around a common lumen so that the overlapping portions occupy a same circuit area, wherein the first conductive coil further comprises a second portion that is continuously formed with the first portion of the first conductive coil through a first transition portion and the second conductive coil further comprises a second portion that is continuously formed with the first portion of the second conductive coil through a second transition portion, wherein the first and second portions of the first conductive coil are disposed on different layers of the plurality of superimposed layers and the first and second portions of the second conductive coil are disposed on different layers of the plurality of superimposed layers, and wherein the first transition portion shares a substantially similar cross-section with the first and second portions of the first conductive coil and extends in a direction between the first and second portions of the first conductive coil that is not perpendicular either to the first or second portions of the first conductive coil, and the second transition portion shares a substantially similar cross-section with the first and second portions of the second conductive coil and extends in a direction between the first and second portions of the second conductive coil that is not perpendicular to either the first or second portions of the second conductive coil.

15. The multidimensional circuit arrangement of claim 14, wherein the capacitance and the inductance are each formed by areas of the superimposed layers that cooperate to form conductors and dielectrics providing said capacitance and at least one looped conductive path providing said inductance.

16. The multidimensional circuit arrangement of claim 15, wherein the inductance is provided by at least one conductive loop having legs occupying at least two of the superimposed layers and connected by at least one via extending between the superimposed layers.

17. The multidimensional circuit arrangement of claim 16, wherein the capacitance is provided at least partly by a conductive area and a dielectric area in adjacent ones of the superimposed layers.

18. The multidimensional circuit arrangement of claim 17, wherein the circuit element comprises at least one semiconductor layer and wherein the capacitance is provided by at least one metal-oxide-semiconductor capacitor device (MOScap) having respective conductive, dielectric and semiconductor portions disposed in adjacent ones of the superimposed layers.

19. The multidimensional circuit arrangement of claim 16, wherein the inductance is provided by at least two said conductive loops respectively having said legs occupying at least two said superimposed layers, wherein the at least two said conductive loops are placed so as to couple electromagnetically, thereby providing a transformer in series with the conductive pathway.

* * * * *